United States Patent [19]

Yoshida

[11] Patent Number: 5,500,787
[45] Date of Patent: Mar. 19, 1996

[54] ELECTRODES ON A MOUNTING SUBSTRATE AND A LIQUID CRYSTAL DISPLAY APPARATUS INCLUDING SAME

[75] Inventor: Hirokazu Yoshida, Osaka, Japan

[73] Assignee: Sharp Kabushiki Kaisha, Osaka, Japan

[21] Appl. No.: 100,072

[22] Filed: Jul. 29, 1993

Related U.S. Application Data

[63] Continuation of Ser. No. 897,604, Jun. 10, 1992, abandoned, which is a continuation of Ser. No. 594,301, Oct. 9, 1990, abandoned.

[30] Foreign Application Priority Data

Oct. 9, 1989 [JP] Japan ................................ 1-263478

[51] Int. Cl.⁶ ........................... H05K 7/02; G02F 1/133; G02F 1/1343
[52] U.S. Cl. .................. 361/779; 174/261; 359/59; 361/760; 361/777
[58] Field of Search ...................... 174/256, 257, 174/260, 261; 235/1 D; 228/180.2; 350/336; 359/59; 361/760, 767, 771, 777, 779; 428/432, 901; 439/68

[56] References Cited

U.S. PATENT DOCUMENTS

| | | | |
|---|---|---|---|
| 3,716,907 | 2/1973 | Anderson | 29/832 |
| 4,109,377 | 8/1978 | Blazick et al. | 174/261 |
| 4,145,120 | 3/1979 | Kubota | 361/411 |
| 4,426,773 | 1/1984 | Hargis | 361/412 X |
| 4,600,935 | 7/1986 | Dresner | 357/76 X |
| 4,649,417 | 3/1987 | Burgess et al. | 357/80 |
| 4,719,152 | 1/1988 | Ohta et al. | 428/432 |
| 4,735,847 | 4/1988 | Fujiwara et al. | 428/901 |
| 4,755,631 | 7/1988 | Churchwell et al. | 174/261 |
| 4,772,820 | 9/1988 | DiSanto et al. | 361/777 |
| 4,853,296 | 8/1989 | Fukuyoshi | 350/336 |
| 4,859,036 | 8/1989 | Yamanaka et al. | 350/336 |
| 4,887,760 | 12/1989 | Yoshino et al. | 228/180.2 |
| 4,917,466 | 4/1990 | Nakamura et al. | 350/336 |
| 4,963,002 | 10/1990 | Tagusa et al. | 350/336 |
| 5,162,933 | 11/1992 | Kakuda et al. | 359/59 |

FOREIGN PATENT DOCUMENTS

| | | | |
|---|---|---|---|
| 0303256 | 2/1989 | European Pat. Off. | |
| 2492164 | 10/1980 | France | |
| 59-129833 | 7/1984 | Japan | 361/779 |
| 60-238817 | 11/1985 | Japan | |
| 61-295639 | 12/1986 | Japan | |
| 62-218939 | 9/1987 | Japan | 361/779 |
| 62-299819 | 12/1987 | Japan | 361/779 |
| 01063929 | 6/1989 | Japan | |
| 2-231737 | 9/1990 | Japan | |
| 2090071 | 10/1981 | United Kingdom | |

OTHER PUBLICATIONS

IBM Disclosure Bulletin "Photo–Defined Lamination for Chip Bonding" by J. C. Edwards vol. 25 No. 4 Sep. 1982.

*Primary Examiner*—Donald A. Sparks
*Attorney, Agent, or Firm*—David G. Conlin; Kevin J. Fournier

[57] ABSTRACT

An electrode wiring on a mounting substrate adapted for use in liquid crystal display apparatus, the electrode wiring including portions of Mo or Mo alloy to which bumps of an integrated circuit such as LSI is bonded with conductive paste.

2 Claims, 5 Drawing Sheets

ELECTRODES ON A MOUNTING SUBSTRATE AND A LIQUID CRYSTAL DISPLAY APPARATUS INCLUDING SAME

This is a continuation of application Ser. No. 07/897,604 filed on Jun. 10, 1992 which is a continuation of U.S. Ser. No. 07/594,301, filed Oct. 9, 1990, both now abandoned.

BACKGROUND OF THE INVENTION

1. Field of the Invention

The present invention relates generally to a wiring arrangement, and more particularly to electrode wiring on a mounting substrate adapted for use in liquid crystal display apparatus, the electrode wiring including portions of Mo or Mo alloy to which bumps of an integrated circuit such as an LSI are connected.

2. Description of the Prior Art

As a method of mounting an integrated circuit (IC) or the like on a substrate, a direct bonding in which IC chips are connected face-down to a substrate is well known. In this method, tiny electrodes formed on the IC chips are connected to electrodes on the mounting substrate with conductive paste, etc. This method is particularly suitable when a large scale integration (LSI) with high integration is mounted on the mounting substrate.

For connection convenience, electrodes of ICs are projected, which are commonly called bumps, and those projected on the mounting substrate connected to the bumps are called pads because of their pad-like nature. A number of circuit pattern wirings are electrically connected to the pads on the mounting substrate.

Japanese Laid-Open Patent Publication No. 60-238817 discloses a method of mounting ICs or the like for driving a liquid crystal by using a glass substrate of a liquid crystal panel as a mounting substrate in the above-mentioned manner. This method makes possible a direct mounting of an IC on the panel for driving a liquid crystal, an LSI, or the like, with the use of an increasing number of pins depending upon a magnification, a high definition, and a minimization of picture element pitches of a liquid crystal display apparatus. This method uses pads made of Au or ITO (Indium Tin Oxide).

However, the above-mentioned known method has the following problems:

When the pad is made of Au, the connection resistance at a connecting portion between the bumps and pads is low and stable. The formation of such a pad requires a gilding process, thereby complicating the step. In addition, Au is expensive, and the production cost becomes high.

When the pads are made of ITO, it is advantageous in that the process of making them can share the process of making transparent electrodes of ITO during the production of a liquid crystal display panel, thereby reducing the number of steps in the process. However, there is a problem that the connection resistance at the connection points between the pad made of ITO and bumps becomes high (5–10Ω). When the connection resistance increases, the voltage applied to the liquid crystal display portion substantially decreases due to a voltage drop at the connection points, so that the quality of the resulting display becomes poor. This is particularly notable in a large-sized or highly definitive liquid crystal display apparatus. These display apparatus generate a number of outputs per IC so as to drive a liquid crystal with high clock frequency, and a greater power consumption in the ICs and a liquid crystal itself, so that instantaneous passage of a current is difficult through the circuit patterns. This causes a further drop of the voltage applied to the liquid crystal display portion.

SUMMARY OF THE INVENTION

The electrode wiring of the present invention, which overcomes the above-discussed and numerous other disadvantages and deficiencies of the prior art, comprises portions of Mo to which bumps of an integrated circuit such as LSI are connected.

According to another aspect of the present invention, the electrode wiring comprises portions of Mo alloy to which bumps of an integrated circuit such as LSI are connected.

In a preferred embodiment, the mounting substrate is the substrate of a liquid crystal display panel.

In a preferred embodiment, the portions of Mo or Mo alloy are connected to the bumps of an integrated circuit through conductive paste.

Thus, the invention described herein makes possible the objectives of (1) providing an electrode wiring which can be connected to an integrated circuit without the possibility of increasing connection resistance at the connecting portions to the integrated circuit, and (2) providing an electrode wiring which can be connected to an integrated circuit easily and economically.

BRIEF DESCRIPTION OF THE DRAWINGS

This invention may be better understood and its numerous objects and advantages will become apparent to those skilled in the art by reference to the accompanying drawings as follows:.

DESCRIPTION OF THE PREFERRED EMBODIMENTS

Figure 1:
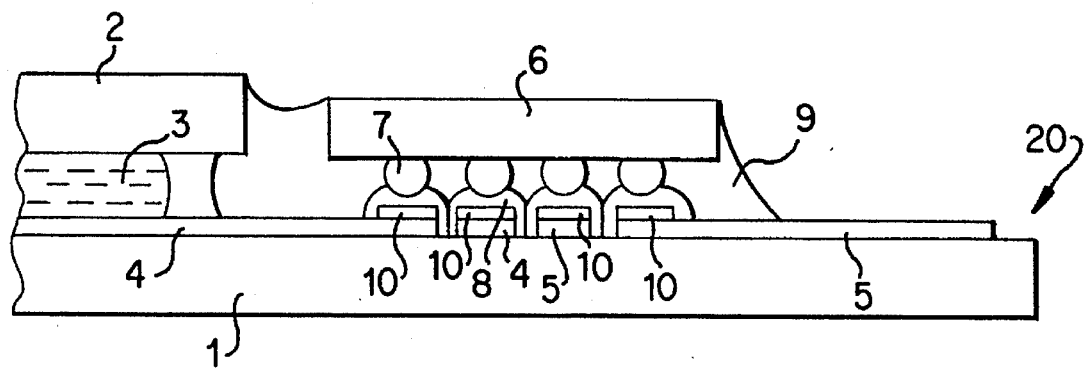
FIG. 1 is a sectional view showing an example of the present invention.

FIG. 1 shows a main portion of a liquid crystal display panel 20 on which electrodes pads 10 are formed. A liquid crystal 3 is liquid-tightly sandwiched between glass substrates 1 and 2 of the liquid crystal display panel 20. On the glass substrate 1 is formed an input circuit pattern wiring 5 and output circuit pattern wiring 4 respectively for a liquid crystal driving LSI 6. The input circuit pattern wiring 5 is connected to an outside control circuit (not shown). The output circuit pattern wiring 4 is connected to a wiring or an electrode in a liquid crystal cell of a display portion of the liquid crystal display panel 20. The circuit pattern wirings 4 and 5 can be made of a transparent conductive film such as an ITO, Ni, Cu/Ni, Ti, Ta, W, or Al.

The pads 10 are disposed at predetermined positions on the circuit pattern wirings 4 and 5 so as to effect connection between the pattern wirings 4, 5, and bumps 7 of the liquid crystal driving LSI 6. The pads 10 are made of Mo.

The liquid crystal driving LSI 6 is connected to the Glass substrate 1 of the liquid crystal panel 20 by a face-down bonding method. The bumps 7 of the LSI 6 is connected to the pads 10, preferably, with conductive paste 8, and is connected to the input circuit pattern wiring 5 and the output circuit pattern wiring 4 through the pads 10. The conductive paste 8 of silver or any other conductive substance is applied at least to the top ends of the bumps 7 by use of a dispenser or a transcriber before the LSI 6 is mounted on the Glass substrate 1. In order to protect the pads 10 from being dissolved or eroded by a solvent or the like used in subsequent processes after the LSIs 6 are mounted, the conductive paste 8 may completely cover the pads 10 as shown in FIGS. 1 to 4, wherein the adjacent conductive pastes 8 are electrically disconnected from each other as with the interposition of a known electrically insulating film which is omitted in FIGS. 1 to 4. Alternatively, the conductive paste 8 may only cover the top portions of the pads 10 as shown in FIGS. 6 to 9, that is, the adjacent conductive pastes 8 are arranged at intervals, thereby eliminating the necessity of interposing an electrically insulating films therebetween. The interval between one pad 10 and the next is preferably 50 μm but it can be larger than 50 μm, for example, 100 μm. Instead of silver, gold paste, copper paste, or carbon paste as the conductive paste 8.

In order to prevent the erosion of the pads 10, an antimoisture resin 9 is filled in the spots between the LSI 6 and the glass substrate 1, and is allowed to harden.

As mentioned above, the pads 10 of Mo have the following advantages:

The pads 10 made of Mo are stable throughout the subsequent processes of forming the liquid crystal panel. For example, an insulating layer likely to increase connection resistance is prevented from being formed on the surface of the pads 10 even if the subsequent process includes a step at which an oxiding reaction occurs. As a result, the connection resistance at the connecting portions between the pads 10 and the bumps 7 is kept constantly low. In the present example, the connection resistance is several hundreds mΩ. In contrast, in the comparative example using pads made of either Ti, Ta, W, or Al the connection resistance between the pads 10 and the bumps 7 is several Ω to several hundreds Ω. Ti, Ta, W, or Al are metal materials whose specific resistances are as low as that of Mo but they are disadvantageous in that they are likely to form an unnecessary insulating layer on the surface of the pads owing to an oxidation reaction during the formation of the panel. In the comparative example, the connection resistance at the connecting points with the bumps 7 is increased because of the presence of this insulating layer.

In the illustrated embodiment the pads 10 are made of Mo, which is not liable to an oxidation reaction, and are bonded to the bumps 7 of the IC with conductive paste 8, so that the connection resistance therebetween is low. Thus, the voltage applied to the liquid crystal display portion is prevented from dropping. Also, the pads 10 covered by the conductive paste 8 are protected against deterioration by a solvent in the course of the subsequent process of forming the panel. As a result, whether it may be a large-sized liquid crystal display apparatus or a highly definitive liquid crystal display apparatus, desired display conditions and high yield are satisfied.

Mo is a relatively cheap material, thereby reducing the production cost. In addition, Mo is used to make wirings and electrodes in the display portions of the liquid crystal display panel 20. Therefore, when the wirings and the electrodes are to be made of Mo, the pads 10 can be made in the same process. As a result, the step of forming the pads 10 is reduced, thereby saving time and money in production.

Figure 2:
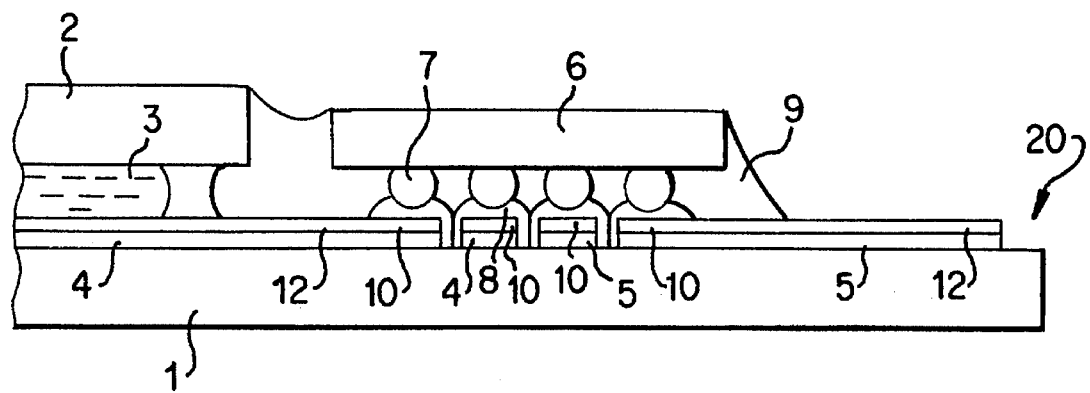
FIGS. 2, 3, 4, and 5 are sectional views showing another examples, respectively.

FIG. 2 shows another example. In this example, the wiring 12 made of Mo is formed in one piece with the pad 10 on the circuit pattern wirings 4 and 5. A current flows through the circuit pattern wirings 4 and 5 and the wiring 12 at the same time, thereby reducing the wiring resistance as a whole.

Figure 3:
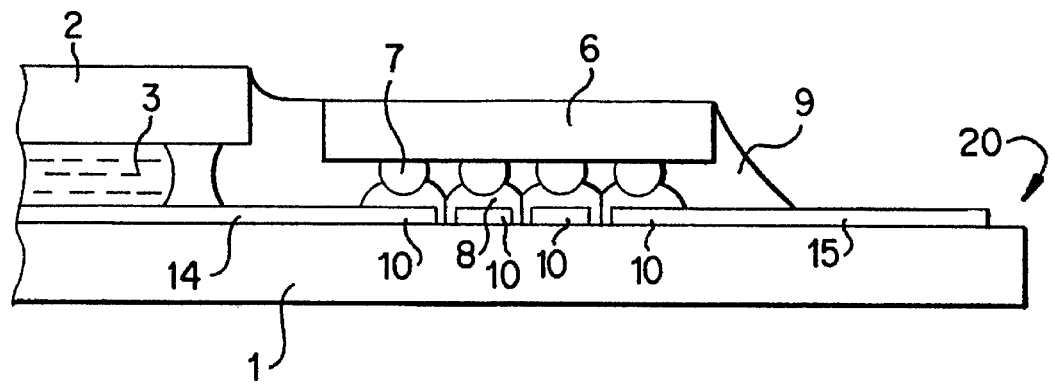

FIG. 3 shows a further example. In this example, the input circuit pattern wiring 15 and output circuit pattern wiring 14 are made of Mo in one piece with the pads 10 of Mo. The pads 10, the circuit pattern wirings 14 and 15 are formed in a single process, thereby reducing the production steps.

Figure 4:
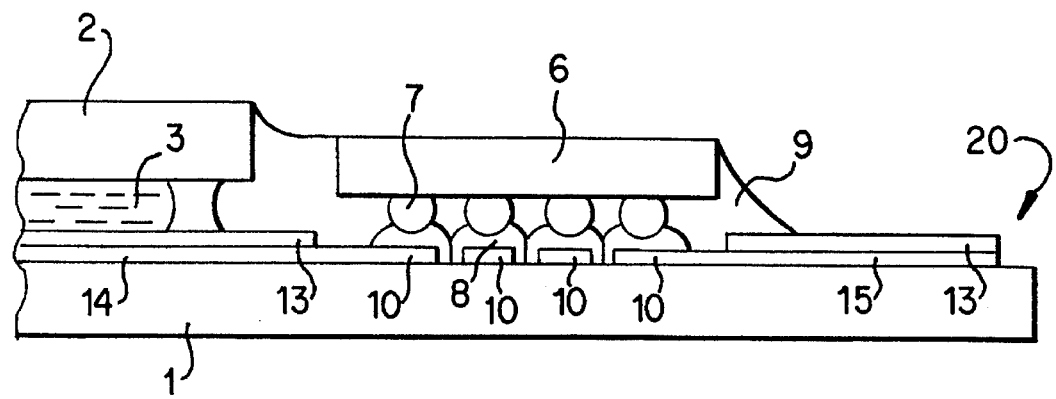

FIG. 4 shows a still further example in which another wiring 13 made of a conductive material other than Mo is mounted on the circuit pattern wirings 14 and 15 of Mo shown in FIG. 3. The wiring 13 is situated at positions other than those at which the bumps 7 of the LSI 6 are connected to the circuit pattern wirings 14 and 15, and at the predetermined position the pads 10 of Mo are bonded to the bumps 7 of the LSI 6 with conductive paste 8. The wiring resistance is reduced.

Figure 5:
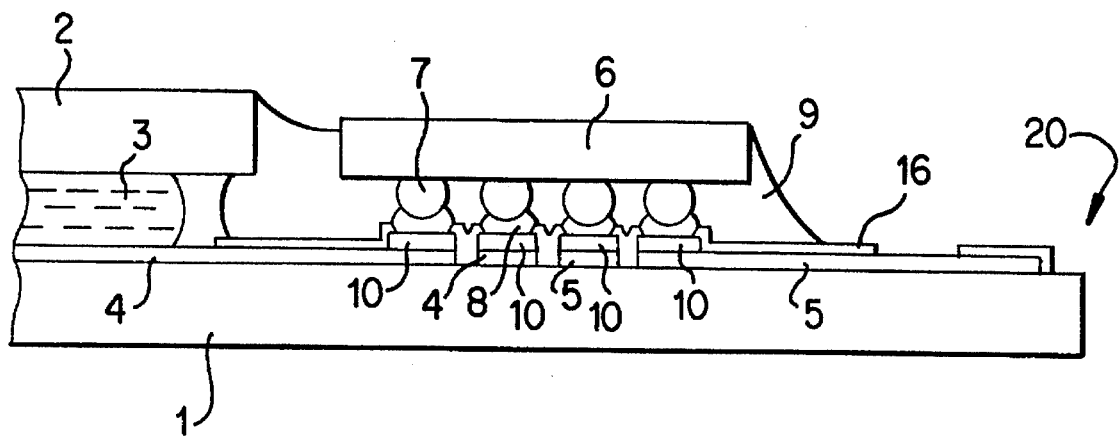
Figure 6:
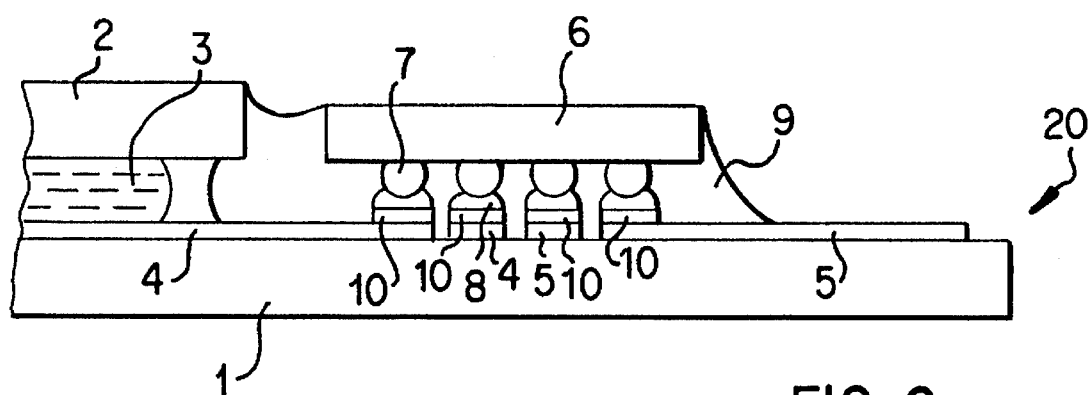
FIGS. 6, 7, 8 and 9 are sectional views showing modifications to the embodiments shown in FIGS. 1, 2, 3 and 4.
Figure 7:
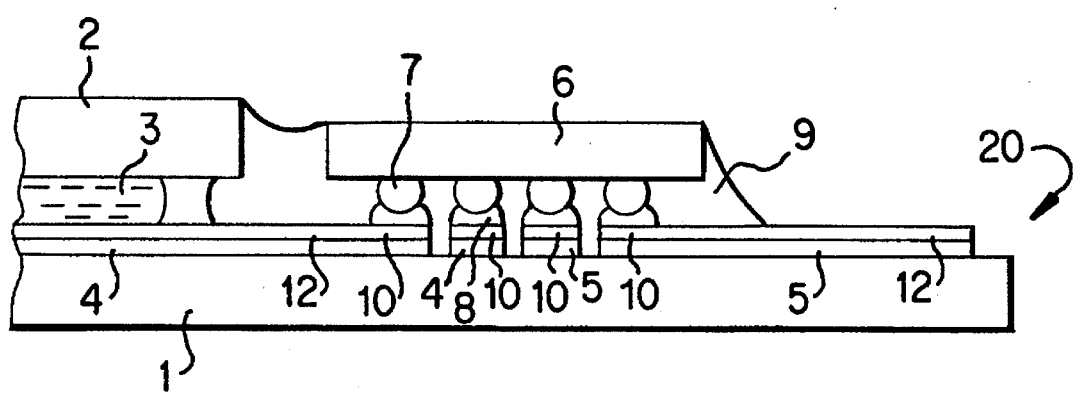
Figure 8:
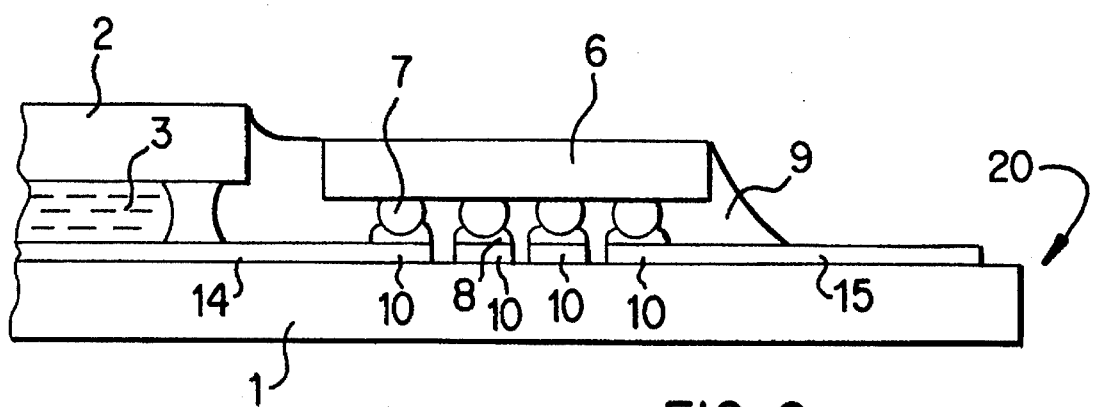
Figure 9:
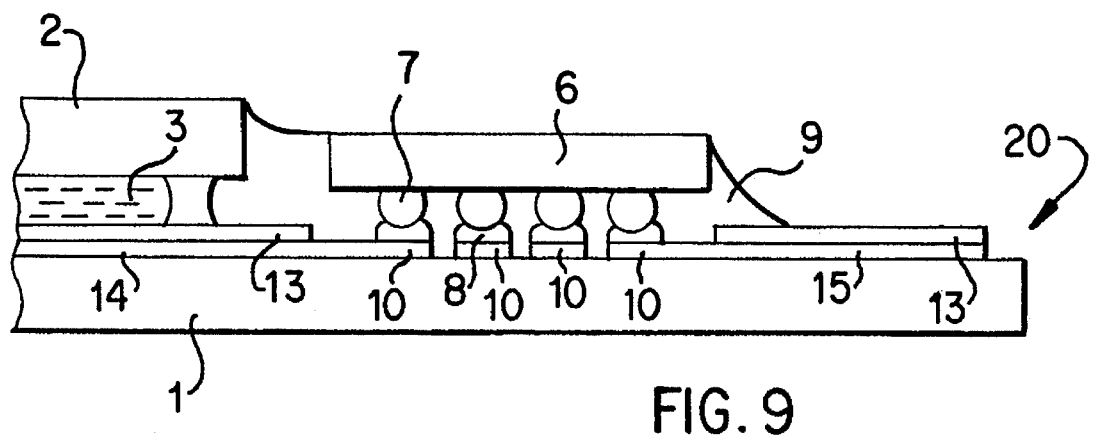

FIG. 5 shows another example in which a protective film 16 made of $SiO_2$, SiN or the like is formed on the circuit pattern wirings 4 and 5 to protect against deterioration of the circuit pattern wirings 4 and 5 not only during the formation of the panel but also after the panel is formed. Thus, the production yield and reliability of the liquid crystal display apparatus is enhanced.

In the illustrated examples, the circuit pattern wirings 4 and 5 are made in single layers of ITO, Ni, Cu/Ni, Ti, Ta, W, or Al. It is of course possible to make the wirings in multi-layers. Experiments have demonstrated that when the pads 10 are made of Mo alloy such as Mo—Si (molybdenum silicide), the same effects are obtainable.

The pads 10 are made of Mo in a single layer, but as long as the portions of the pads 10 bonded to the bumps 7 of the liquid crystal driving LSI 6 are made of Mo or Mo alloy, the pads 10 can be multi-layered if the top layers are made of Mo or Mo alloy.

The glass substrate 1 of the liquid crystal display panel 20 is used as a mounting substrate, but the material for the mounting substrates is not limited to glass. Various materials can be used. Therefore, because of the adoption of a variety of material, the electrodes of the present invention are applicable to computers and any other electronic apparatus.

As is evident from the foregoing, the present invention reduces processing steps, thereby saving time and money of the production. The connection resistance at the connecting portions between the electrodes on the mounting substrate and the bumps of the integrated circuit becomes low, thereby preventing the voltage applied to drive the liquid crystal from dropping.

Since the electrode wiring on the substrate of a liquid crystal display panel is connected to the bumps of an integrated circuit such as an LSI for driving a liquid crystal through Mo or Mo alloy layers, the connection resistance therebetween is advantageously reduced, thereby preventing the voltage applied to the liquid crystal display portion from ineffectively dropping. Because of this advantage, whether it may be a large-sized liquid crystal display apparatus or a highly definitive liquid crystal display apparatus, satisfactory display conditions and production yields can be obtained. Moreover, when wirings and electrodes are made of Mo or Mo alloy for the liquid crystal display portion, the production process is simplified with a reduced number of steps. This reduces the production cost.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An electrode wiring on a mounting substrate adapted for use in liquid crystal display apparatus, the electrode wiring comprising:

pads of Mo to which bumps of an integrated circuit are connected through conductive paste, said Mo pads being arranged at intervals;

an input circuit pattern wiring and an output circuit pattern wiring both of which are made of the same materials, and an anti-moisture resin filled in the spots between the integrated circuit and the substrate;

wherein said input circuit pattern wiring and said output circuit pattern wiring are made of Mo, and said Mo pads are disposed on and formed integrally with said Mo input circuit pattern wiring and said Mo output circuit pattern wiring; and wherein the mounting substrate is a substrate of a liquid crystal display panel.

2. An electrode wiring on a mounting substrate adapted for use in a liquid crystal display apparatus, the electrode wiring comprising:

pads of Mo alloy to which bumps of an integrated circuit are connected through conductive paste, said Mo alloy pads being arranged at intervals;

an input circuit pattern wiring and an output circuit pattern wiring both of which are made of the same materials; and an anti-moisture resin filled in the spots between the LSI and the substrate, wherein said input circuit pattern wiring and said output circuit pattern wiring are made of Mo alloy, and said Mo alloy pads are disposed on and formed integrally with said Mo alloy input circuit pattern wiring and said Mo alloy output circuit pattern wiring;

wherein the mounting substrate is a substrate of a liquid crystal display panel.

* * * * *